United States Patent
Leobandung (10) Patent No.: US 11,652,009 B2
(45) Date of Patent: May 16, 2023

(54) SECURE INSPECTION AND MARKING OF SEMICONDUCTOR WAFERS FOR TRUSTED MANUFACTURING THEREOF

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 239 days.

(21) Appl. No.: 16/675,666

(22) Filed: Nov. 6, 2019

(65) Prior Publication Data

US 2021/0134682 A1 May 6, 2021

(51) Int. Cl.

| | | |
|---|---|---|
| H01L 21/66 | (2006.01) | |
| H01L 21/67 | (2006.01) | |
| H01L 23/00 | (2006.01) | |
| H01L 23/544 | (2006.01) | |

(52) U.S. Cl.
CPC ........ *H01L 22/20* (2013.01); *H01L 21/67282* (2013.01); *H01L 21/67288* (2013.01); *H01L 21/67294* (2013.01); *H01L 22/12* (2013.01); *H01L 23/544* (2013.01); *H01L 23/573* (2013.01); *H01L 2223/54433* (2013.01); *H01L 2223/54453* (2013.01)

(58) Field of Classification Search
CPC ........... H01L 21/67144; H01L 21/6835; H01L 33/0079; H01L 25/0753; H01L 2933/0033; H01L 2221/68368; H01L 22/20; H01L 21/67282; H01L 21/67288; H01L 21/67294; H01L 22/12; H01L 23/544; H01L 23/573; H01L 2223/5443; H01L 2223/54453; H01L 2223/5442
See application file for complete search history.

(56) References Cited

U.S. PATENT DOCUMENTS

| | | | |
|---|---|---|---|
| 6,953,947 B2 | 10/2005 | Sakaguchi | |
| 7,057,259 B2 * | 6/2006 | Arikado | ................ H01L 23/544 |
| | | | 257/E23.179 |
| 7,700,381 B2 | 4/2010 | Arikado et al. | |
| (Continued) | | | |

FOREIGN PATENT DOCUMENTS

| | | |
|---|---|---|
| JP | 03211717 | 9/1991 |
| JP | 05055354 | 3/1993 |
| KR | 20060124442 | 5/2005 |

*Primary Examiner* — Mamadou L Diallo
(74) *Attorney, Agent, or Firm* — Fleit Intellectual Property Law; Thomas S. Grzesik (57) ABSTRACT

A method for securing and verifying semiconductor wafers during fabrication includes receiving a semiconductor wafer after a layer of features has been patterned thereon. At least one security mark is formed at one or more locations embedded within a backside of the semiconductor wafer by implanting an inert species at the one or more locations. At a subsequent point in fabrication and/or after fabrication of the semiconductor wafer has completed the backside of the wafer is inspected for detection of the at least one security mark. If the at least one security mark is not detected at an expected location within the backside of the semiconductor wafer a determination is made that the semiconductor wafer has been compromised.

15 Claims, 7 Drawing Sheets

(56) References Cited

U.S. PATENT DOCUMENTS

| | | | |
|---|---|---|---|
| 10,901,391 B1* | 1/2021 | Saraswatula | H01L 23/544 |
| 2010/0035403 A1* | 2/2010 | Brown | H01L 27/12 |
| | | | 438/422 |
| 2015/0228717 A1* | 8/2015 | Hara | H01L 29/0626 |
| | | | 257/140 |
| 2017/0256466 A1* | 9/2017 | Bishop | H01L 21/78 |
| 2018/0182625 A1* | 6/2018 | Nishiwaki | H01L 21/2253 |

* cited by examiner

SECURE INSPECTION AND MARKING OF SEMICONDUCTOR WAFERS FOR TRUSTED MANUFACTURING THEREOF

BACKGROUND OF THE INVENTION

The present disclosure generally relates to the field of semiconductors, and more particularly relates to secure inspection and marking of semiconductor devices for trusted manufacturing thereof.

Semiconductor chip security has become increasingly important in recent years. One mechanism for securing semiconductor chips is through the use of trusted foundries. A trusted foundry adheres to a set of protocols to ensure the integrity, authenticity, and confidentiality of semiconductor chips during manufacturing. However, trusted foundries may not be available to all chip customers or may not have the capabilities to fabricate a desired semiconductor chip. Therefore, in many instances chip customers utilize untrusted foundries for manufacturing of their semiconductor chips.

The use of untrusted foundries for semiconductor chip manufacturing presents various security concerns since the chip customer may not be able to control or monitor the manufacturing process at an untrusted foundry. For example, an untrusted foundry may be able to counterfeit the semiconductor chip, reverse engineer the layout of the semiconductor chips, or steal sensitive or secret data required for fabrication of the semiconductor chip. In addition, there is no guarantee that the fabricated semiconductor chips do not contain malicious or damaging features that have been added by the untrusted foundry. Unfortunately, viable solutions to the above problems currently do not exist.

SUMMARY OF THE INVENTION

In one embodiment, a method for securing and verifying semiconductor wafers during fabrication comprises receiving a semiconductor wafer after a layer of features has been patterned thereon. At least one security mark is formed at one or more locations embedded within a backside of the semiconductor wafer by implanting an inert species at the one or more locations.

In another embodiment, a method for securing and verifying semiconductor wafers during fabrication comprises receiving a semiconductor wafer. Security mark data is obtained for a semiconductor wafer expected to be received. The security mark data at least indicates one or more wafer locations at which at least one security mark is expected. The received semiconductor wafer is inspected for detection of the at least one security mark at the one or more wafer locations. A determination is made that the received semiconductor wafer is a secure wafer based on the at least one security mark having been detected at the one or more wafer locations. A determination is made that the received semiconductor wafer is a compromised wafer based on the at least one security mark failing to have been detected at the one or more wafer locations.

In a further embodiment, a method for securing and verifying semiconductor wafers during fabrication comprises receiving, from a fabrication line, a first semiconductor wafer after a layer of features has been patterned thereon. A determination is made if the layer of features matches an expected layer of features. At least one security mark is formed at one or more locations embedded within the first semiconductor wafer based on the layer of features matching the expected layer of features. The first semiconductor wafer is transferred back to the fabrication line after the least one security mark has been formed. A second semiconductor wafer is received. Security mark data is obtained for the first semiconductor wafer based on the receiving the second semiconductor wafer. The security mark data indicates at least the one or more locations at which the at least one security mark is expected. The second semiconductor wafer is inspected for detection of the at least one security mark at the one or more locations. The second semiconductor wafer is determined to be the first semiconductor wafer in an uncompromised state based on the at least one security mark having been detected at the one or more wafer locations.

In an additional embodiment, a system for securing and verifying semiconductor wafers during fabrication comprises at least one information processing system. The at least one information processing system includes memory and one or more processors. The system further comprises one or more wafer marking systems communicatively coupled to the at least one information processing system. The at least one information processing system and the one or more wafer marking systems operate to perform a process comprising receiving a semiconductor wafer after a layer of features has been patterned thereon. At least one security mark is formed at one or more locations embedded within a backside of the semiconductor wafer by implanting an inert species at the one or more locations.

In yet another embodiment, a computer program product for securing and verifying semiconductor wafers during fabrication comprises a computer readable storage medium having program instructions embodied therewith. The program instructions executable by an information processing system to perform a method. The method comprises receiving a semiconductor wafer after a layer of features has been patterned thereon. At least one security mark is formed at one or more locations embedded within a backside of the semiconductor wafer by implanting an inert species at the one or more locations.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments are discussed herein. However, it is to be understood that the provided embodiments are merely examples and that the systems and methods described below can be embodied in various forms. Therefore, specific structural and functional details discussed herein are not to be interpreted as limiting, but merely as a basis for the claims and as a representative basis for teaching one skilled in the art to variously employ the present subject matter in virtually any appropriately detailed structure and function. Further, the terms and phrases used herein are not intended to be limiting, but rather, to provide an understandable description of the concepts.

As will be discussed in greater detail below, embodiments of the present invention overcome security issues associated with untrusted semiconductor foundries by utilizing a trusted pattern verification and wafer marking process. According to at least one embodiment, after each layer of patterned features is formed on a semiconductor wafer a trusted pattern verification system is utilized to verify the formed pattern matches the intended pattern as defined by a corresponding design for the layer. If the formed pattern and the intended pattern do not match the verification system determines that the semiconductor wafer was compromised. If the formed pattern and the intended pattern do match then verification system determines that the wafer is secure (i.e., has not been compromised).

However, once a subsequent layer of patterned features has been formed it is difficult (if not impossible) to re-verify previously formed layers of patterns since removing layers would damage the semiconductor wafer. This presents the opportunity for a secure (authentic) semiconductor wafer to be replaced with an unauthorized wafer comprising damaging or malicious features. For example, after a given layer of patterns has been verified by the trusted verification system the authorized semiconductor wafer is returned to the fabrication line of the untrusted foundry. At this point, damaging or malicious features may be added to an unauthorized semiconductor wafer and a subsequent layer of patterned features corresponding to the trusted mask may be formed thereon. In other words, the malicious features are hidden under a layer of patterned features that match the intended/expected features defined by the trusted mask. Therefore, when the unauthorized semiconductor wafer is transferred to the trusted verification system the verification process may not determine that the current wafer is an unauthorized or malicious wafer since the current layer of patterned features corresponds to the expected layer of patterned features.

Embodiments of the present invention overcome this problem by utilizing a trusted marking system to discretely mark the semiconductor wafer. According to at least one embodiment, after a given layer of patterned features has been verified the trusted marking system marks the semiconductor wafer and inspects the wafer after fabrication has been completed to verify the markings. For example, the trusted marking system may implant an inert species into the backside of the semiconductor wafer after one or more given layers of features have been patterned. The location of the implanted species, depth of the implant, species type, and/or the like may be recorded. Then, after fabrication of the semiconductor wafer has completed (or at any other desired point in time) the trusted verification system analyzes the locations on the backside of the wafer where the markings are supposed to be. If all of the markings are at their recorded locations then the inspection system determines that the wafer is a secure/authentic wafer that has not been replaced.

Figure 1:
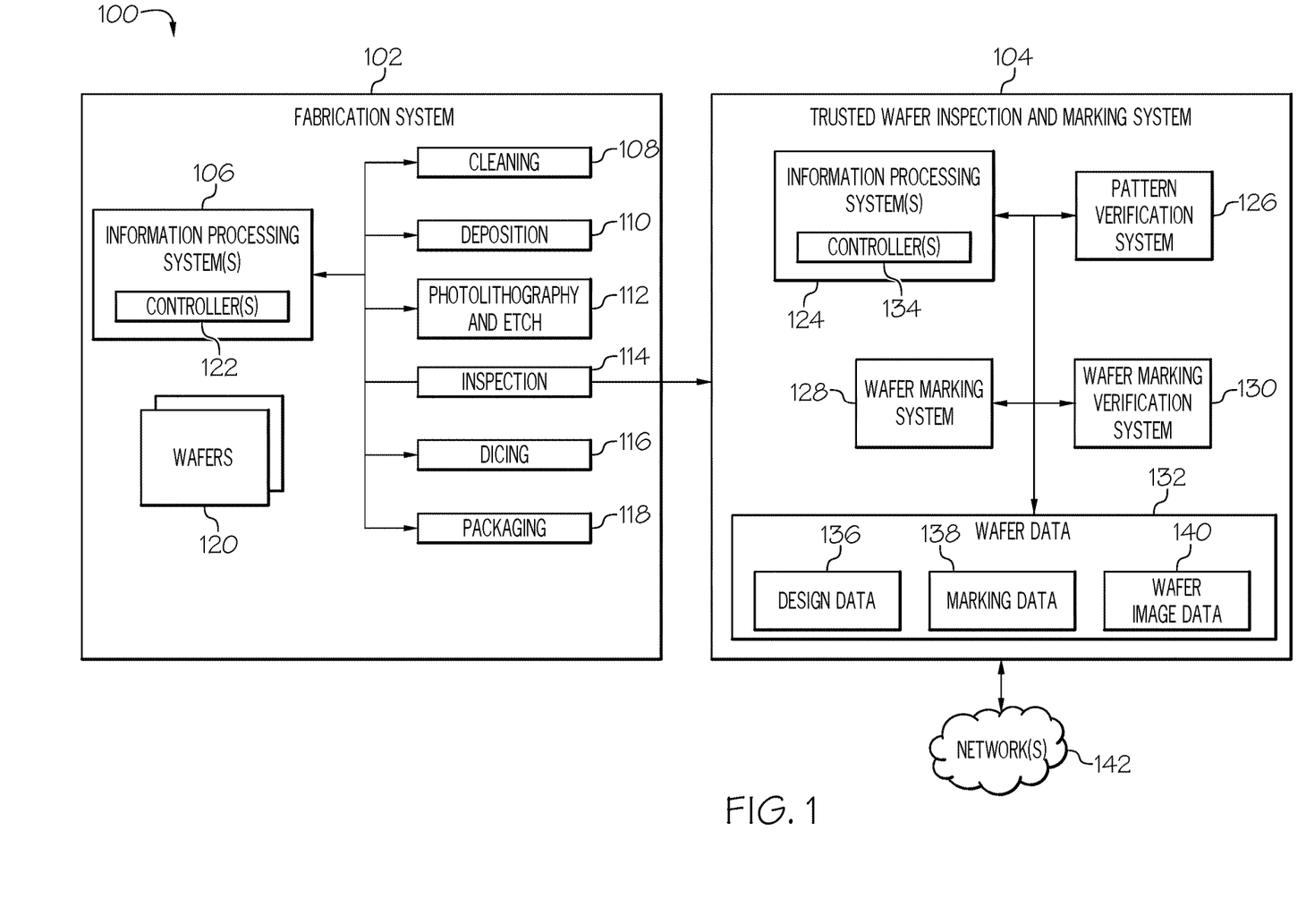
FIG. 1 is a block diagram illustrating a system for securing and verifying semiconductor wafers during fabrication according one embodiment of the present invention.

Referring now to the drawings in which like numerals represent the same of similar elements, FIG. 1 illustrates a block diagram of a system 100 for the trusted inspection and verification of semiconductor wafers during manufacturing thereof. In various embodiments, the system 100 comprises a semiconductor fabrication plant 102 (e.g., a foundry) and a trusted wafer inspection and marking system (TWIMS) 104. The semiconductor fabrication plant 102 is responsible for the manufacturing and packaging of semiconductor devices. In one embodiment, the semiconductor fabrication plant 102 comprises one or more information processing systems 106; fabrication and packaging stations/components 108 to 118; and semiconductor wafers 120.

The information processing system 106 controls the one or more fabrication/packaging stations and their components. In one embodiment, the information processing system 106 may comprise at least one controller 122 that may be part of one or more processors or may be a component that is separate and distinct from the processor(s) of the information processing system 106. The one or more fabrication and packaging stations 108 to 118 may include a cleaning station 108, a deposition station 110, a photolithography station 112, an inspection station 114, a dicing station 116, a packaging station 118, and/or the like.

In some embodiments, two or more of fabrication/packaging stations are separate from each other where the semiconductor wafer 120 is moved from one station to a different station after processing. However, in other embodiments, two or more of these stations may be combined into a single station. In addition, one or more of the stations/components 108 to 118 may not be a physical station per se but may refer to a fabrication or packaging process(es) performed by components of the fabrication plant 102. In some embodiments, one or more of the stations/processes 108 to 118 may be removed from the plant 102 and/or additional stations/processes may be added. Also, embodiments of the present invention are not limited to a semiconductor fabrication plant configured as shown in FIG. 1 and are applicable to any semiconductor fabrication plant.

The TWIMS 104, in one embodiment, comprises one or more information processing systems 124, a pattern verification system 126, a wafer marking system 128, a wafer marking verification system 130, and wafer data 132. It should be noted that the TWIMS 104 is not limited to these components as one or more components may be removed and/or additional components may be added to the TWIMS 104. In one embodiment, the information processing system 124 may comprise at least one controller 134 that may be part of one or more processors or may be a component that is separate and distinct from the processor(s) of the information processing system 124. The wafer data 132, in one embodiment, comprises design data 136, marking data 138, and wafer image data 140. In some embodiment, the TWIMS 104 is communicatively coupled to one or more networks 142 such as a local area network (LAN), a general wide area network (WAN), and/or a public network (e.g., the Internet).

It should be noted that the information processing system 124 may be separate from or part of the pattern verification system 126, wafer marking system 128, and wafer marking verification system 130. In addition, the various operations discussed below as being performed by the information processing system 124 may be similarly performed by separate information processing systems disposed within each of the pattern verification system 126, wafer marking system 128, and/or wafer marking verification system 130. In addition, the various operations discussed below as being performed by these systems 126, 128, 130 may be similarly performed by the information processing system 124. Also, the pattern verification system 126, wafer marking system 128, and wafer marking verification system 130 are not required to be separate from each other and two or more of these systems may be implemented as a single system.

Embodiments of the present invention utilize the TWIMS 104 to perform trusted inspection/verification and marking of the wafers 120. In one or more of these embodiment, the TWIMS 104 is a trusted system that is secured by physical and/or software-based mechanisms that prevent unauthorized access to and tampering with the TWIMS 104. The TWIMS 104 may be located within (or nearby) the semiconductor fabrication plant 102 in a manner that prevents unauthorized access to the TWIMS 104. For example, the TWIMS 104 may be located within a room or nearby building that only authorized individuals have access to. These individuals may be authorized to access the TWIMS 104 by the owner/operator of the TWIMS 104, the customer for which the semiconductor wafers 120 are being fabricated, a trusted entity managing the semiconductor wafers 120, and/or the like. In another embodiment, the TWIMS 104 is part of the fabrication/packaging line where only authorized individuals may make changes to the TWIMS 104. The TWIMS 104 and its components are discussed in greater detail below. In some embodiments, the wafer marking verification system 130 is located at a customer's location instead of or in addition to being located at the semiconductor fabrication plant 102.

Figure 2:
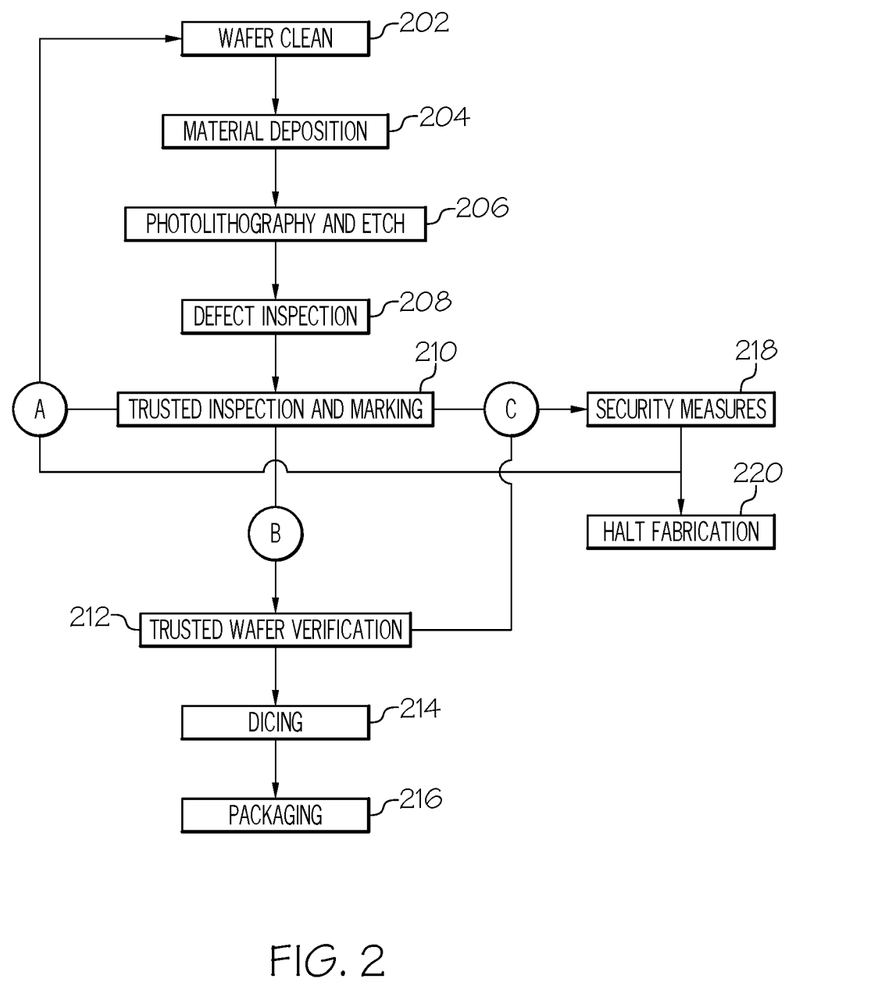
FIG. 2 is an operational flow diagram illustrating an overall process of securing and verifying semiconductor wafers during fabrication according one embodiment of the present invention.

FIG. 2 is an operational flow diagram illustrating an overall process of fabricating a semiconductor device including trusted inspection and marking of the semiconductor wafer 120. The process shown in FIG. 2 begins after the wafer 120 has been inspected for any defects. After the wafer 120 has been inspected, the wafer 120 is processed by the cleaning station 108 at step 202. The cleaning station 108 removes any contaminants from the surface of the wafer 120 using, for example, a wet chemical treatment. Then, the wafer 120 is processed by the deposition station 110 at step 204. The deposition station 110 deposits, grows, and/or transfers one or more layers of various materials are onto the wafer using processes such as chemical vapor deposition (CVD), physical vapor deposition (PVD), atomic layer deposition (ALD), and/or the like.

After the desired materials have been deposited the wafer 120 is processed by the photolithography and etching station 112 at step 206. For example, the wafer 120 may be cleaned and prepared by removing any unwanted moisture from the surface of the wafer 120. An adhesion promoter may also be applied to the surface of the wafer 120. A layer of photoresist material is then formed on the surface of wafer 120 (or the adhesion promoter layer if formed). A process such as, but not limited to, spin coating may be used to form the photoresist layer. Excess photoresist solvent may be removed by pre-baking the coated semiconductor wafer 120. The photoresist coated wafer 120 is then exposed to one or more patterns of light. The patterns may be formed by projecting the light through a photomask (also referred to herein as "mask") created for the current layer. The mask is formed based on trusted design data 136 and may be produced by the semiconductor fabrication plant 102, a photomask fabrication plant, and/or the like. The design data 136, in one embodiment, comprises all shapes/patterns that are intended to be printed on the wafer 120 for a given layer. In some embodiments, the patterns may be formed using a maskless process.

The bright parts of the image pattern cause chemical reactions, which result in one of the following situations depending on the type of resist material being used. Exposed positive-tone resist material becomes more soluble so that it may be dissolved in a developer liquid, and the dark portions of the image remain insoluble. Exposed negative-tone resist material becomes less soluble so that it may not be dissolved in a developer liquid, and the dark portions of the image remain soluble.

A post exposure bake (PEB) process may be performed that subjects the wafer 120 to heat for a given period of time after the exposure process. The PEB performs and completes the exposure reaction. The PEB process may also reduce mechanical stress formed during the exposure process. The wafer 120 is then subjected to one or more develop solutions after the post exposure bake. The develop solution(s) dissolves away the exposed portions of the photoresist. After development, the remaining photoresist forms a stenciled pattern across the wafer surface, which accurately matches the desired design pattern. An etching process is then performed that subjects the wafer 120 to wet or dry chemical agents to remove one or more layers of the wafer 120 not protected by the photoresist pattern. Any remaining photoresist material may then be removed after the etching process using, for example, chemical stripping, ashing, etc. It should be noted that semiconductor fabrication is not limited to the above described process and other fabrication processes are applicable as well.

The photolithographic process results in a layer of patterned features (also referred to herein as a "layer of patterns", "layer of features", "pattern of features", "patterns", and/or "pattern"). After the current layer of features has been patterned the wafer 120 is processed by one or more defect inspection stations 114 at step 208. In one embodiment, the defect inspection station 114 inspects the current layer of patterned features for defects and corrects/manages any defects using one or more methods known to those of ordinary skill in the art. Once the defect inspection process has been performed the wafer 120 is passed to the TWIMS 104 for trusted inspection and marking of the wafers 120 at step 210. In some embodiments, instead of having a separate defect inspection station 114 the TWIMS 104 performs defect inspection in addition to trusted inspection and marking of the wafers 120. In these embodiments, the wafer is passed to the TWIMS 104 after the current layer of features has been patterned at step 206. The TWIMS 104 and its trusted inspection and marking operations are discussed in greater detail below with respect to FIGS. 3 and 4.

After the current layer of patterned of features has been verified and the wafer 120 marked (or not marked) with a security mark, the wafer 120 is passed back to the cleaning station 108 as indicated by path "A". The above described processes are then repeated until all of the desired layers of patterned features have been formed and fabrication of the wafer 120 has been completed. However, if the TWIMS 104 determines fabrication of the wafer 120 has been completed the process follows path "B" and the TWIMS 104 performs a trusted wafer verification process on the wafer 120 at step 212 as will be discussed in greater detail with respect to FIG. 4. If the wafer verification process is unable to verify the completed wafer (e.g., wafer has been tampered with or expected wafer has been replaced), the process follows path "C" where one or more security measures are taken at step 218 and fabrication is optionally stopped at step 220, as will be discussed in greater detail below.

Once the completed wafer 120 has been inspected and verified, the wafer is processed by the dicing station 116 to separate the dies from the wafer 120 at step 214. The packaging station 118 then packages and tests the dies using one or more packaging and testing methods at step 216. It should be noted that if at any point during the inspection/verification processes the TWIMS 104 determines that patterned features and/or completed wafer has been compromised due to unauthorized changes the process follows path "C" where one or more security measures are taken at step 218 and fabrication is optionally stopped at step 220, as will be discussed in greater detail below.

Figure 3:
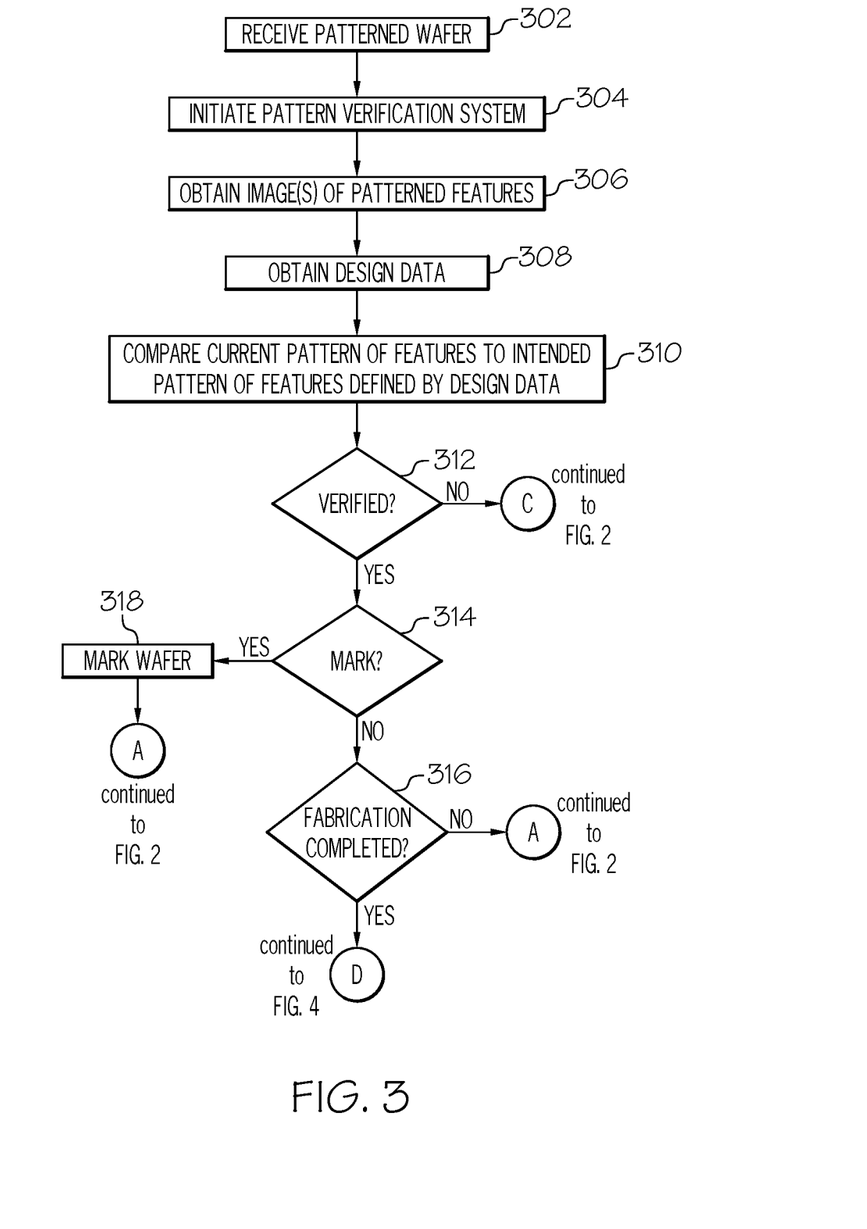
FIG. 3 is an operational flow diagram illustrating a more detailed process of the trusted inspection and marking operation shown in step 210 of FIG. 2 according one embodiment of the present invention.

FIG. 3 is an operational flow diagram illustrating an overall process of the inspection and marking operations performed by the TWIMS 104 at step 210 of FIG. 2. As discussed above, after a layer of features has been patterned on the wafer 120 and defect inspection has completed the wafer 120 is transferred to the TWIMS 104. The TWIMS 104 receives the wafer 120 at step 302. The information processing system 124 initiates the pattern verification system 126 at step 304. In one embodiment, the pattern verification system 126 is initiated based on events such as detecting that the wafer has been transferred to the TWIMS 104, a user input received locally at the TWIMS 104, a remote user input signal, a signal received from one or more of the stations/components of the semiconductor fabrication plant 102, and/or the like.

Upon initiation, the pattern verification system 126 analyzes the wafer 120 and obtains image data 140 for the wafer 120 at step 306. The image data 140 is stored in local storage and/or in remote storage and may be annotated with a unique identifier that uniquely identifies the associated wafer 120. In one embodiment, the image data 140 comprises one or more images of feature patterns across the entire wafer 120, across one or more dies of the wafer 120, across portions of one or more dies, and/or the like. The image data 140, in one embodiment, is obtained using a scanning electron microscope (SEM), transmission electron microscope (TEM), an optical-based scanner or imaging system, a radiation-based imaging system, a combination of some/all of the above, and/or the like.

The pattern verification system 126 obtains the design data 136 for the current fabrication layer of the wafer 120 at step 308. For example, if the current fabrication layer is Layer_1 the design data 136 for Layer_1 is obtained. The design data 136 may be stored locally on the TWIMS 104 or on a trusted remote system. The design data 136 may comprise attributes or metadata that enables the pattern verification system 126 to determine the set of design data 136 associated with the current fabrication layer being inspected. The design data 136, in one embodiment, further comprises data such as pattern locations/coordinates, pattern layouts, pattern shapes, pattern dimensions (e.g., length and width), and/or the like utilized by a photomask fabricator to fabricate the photomask. The design data 136 may also comprise a simulated or rendered pattern layout for the current fabrication layer.

Figure 5:
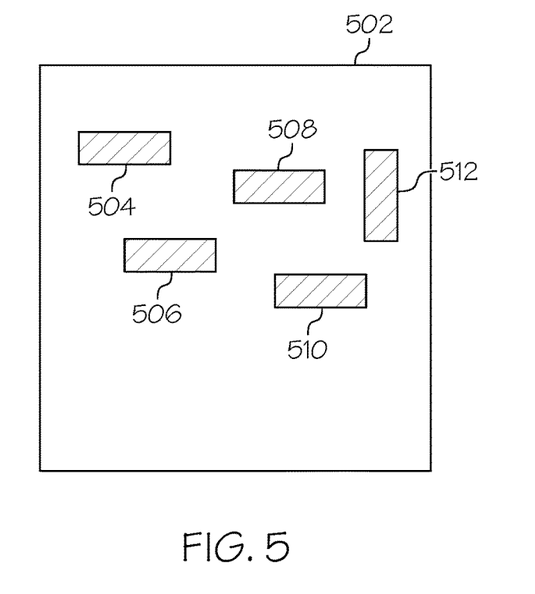
FIG. 5 is an illustrative example of design data according one embodiment of the present invention.

The pattern verification system 126, at step 310, then compares the image data 140 for the current layer of patterned features with the corresponding design data 136 to determine if the current pattern of features on the wafer 120 matches the intended pattern of features as defined by the design data 136. For example, FIG. 5 shows one example of design data 502 comprising a plurality of desired patterns 504 to 512. In this example, the design data 502 comprises a rendered or simulated desired layout of patterns associated with the current fabricated layer of the wafer 120.

Figure 6:
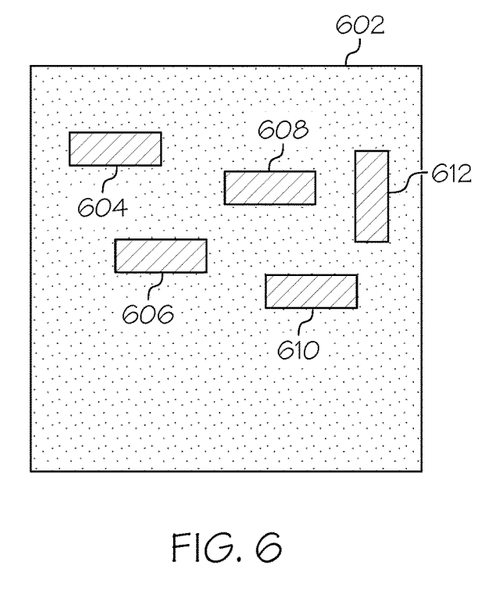
FIG. 6 is an illustrative example of imaging data associated with a layer of features patterned on a semiconductor wafer that is used as part of the trusted inspection and marking operations of FIGS. 2 and 3 according one embodiment of the present invention.

FIG. 6 shows one example of wafer image data 602 comprising obtained for the current layer of patterned features of the wafer 120. The pattern verification system 126, in this example, compares the desired pattern layout shown in FIG. 5 to fabricated pattern layout shown in FIG. 6 and determines that layout, shape, size, etc. of the desired patterns 504 to 512 and actual patterns 604 to 612 match (at least within a given threshold). Therefore, the current layer of patterned features is considered verified and the wafer 120 is considered secure (e.g., not compromised) since the layer of patterned features matches the desired layer of patterned features.

Figure 7:
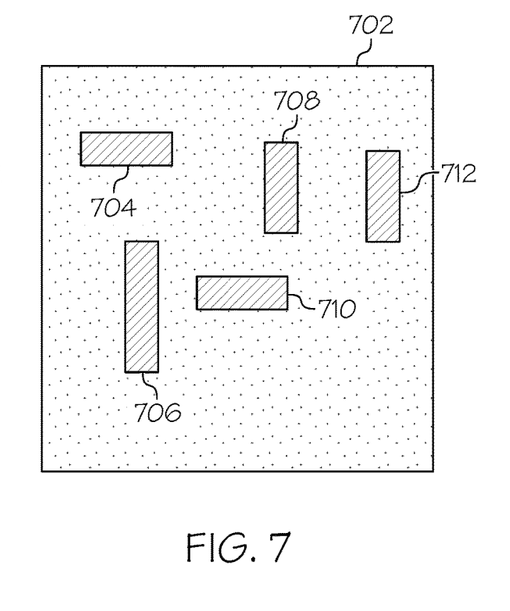
FIG. 7 is another illustrative example of imaging data associated with a layer of features patterned on a semiconductor wafer that is used as part of the trusted inspection and marking operations of FIGS. 2 and 3 according one embodiment of the present invention.

However, consider the wafer image data 702 shown in FIG. 7 representing another example of a fabricated layer of patterned features for the wafer 120. In this example, the pattern verification system 126 determines that the pattern of features for the current layer does not match desired pattern of features as defined by the design data 502 shown in FIG. 5. For example, features 706 to 710 of FIG. 7 do not match the position/location and shape of features 706 to 710 of FIG. 7. Therefore, the layer of patterned features associated with the wafer image data 702 of FIG. 7 is considered "not verified" or "tampered with" and the corresponding wafer is considered compromised.

The pattern verification system 126 may utilize various techniques to compare the wafer image data 140 for the current layer of patterned features with the corresponding design data 136. For example, in one embodiment, image analysis techniques are utilized to compare an image of the current feature patterns to a rendered/simulated image of the intended feature patterns defined by the design data 136. In some embodiments, an actual image of the corresponding photomask may be utilized as well. In another embodiment, data such as pattern locations/coordinates, pattern shapes, pattern dimensions (e.g., length and width), and/or the like are extrapolated from the image 140 of the current pattern of features and compared to similar data in the design data 136.

It should be noted that other methods/techniques for comparing the image 140 of the current pattern of features and corresponding design data 136 are applicable as well. In one embodiment, the pattern verification system 126 stores the results of pattern inspection operation as part of the wafer data 132. For example, data such as a unique identifier associated with the wafer 120, an identifier associated with the current patterned layer being inspected, time and date, an indication whether the inspected layer is verified or not verified (e.g., unauthorized changes/modifications made to the layer), and/or the like.

Returning now to FIG. 3, if the pattern verification system 126 at step 312 determines that the current layer of patterned features has been tampered with the flow proceeds to entry point C of FIG. 2 where one or more security measures are taken at step 218. For example, the information processing system 124 may generate one or more commands that are issued to one or more components of the fabrication facility 102 to shut down production. In another example, the information processing system 124 may automatically (or be manually instructed to) destroy the compromised wafer 120. Alternatively, the information processing system 124 may instruct one or more components of the TWIMS 104 to remove the compromised wafer 120 from the fabrication line and place the compromised wafer in a quarantine area where the chips may be further inspected by authorized personnel.

In yet another example, a message(s) may be sent from the information processing system 124 to one or more information processing systems via the network 142 indicating that a given wafer 102 has been compromised. The message may be sent as soon as a determination is made that the wafer 120 has been compromised, after fabrication of the wafer 120 has completed, after fabrication of a given number of wafers 120 has been completed, and/or the like. The message, in one embodiment, comprises data such as the unique identifier associated with the wafer 120, the identifier associated with the current patterned layer that has been compromised, time and date of layer inspection, fabrication facility identifier, and/or the like. The entity receiving the message(s) may then take an appropriate action. After security measures have been taken, processing may return to step 202 for the next layer or wafer to be fabricated or fabrication may be stopped at step 220 depending on the configuration of the TWIMS 104.

Returning now to step 312 of FIG. 3, if the pattern verification system 126 determines that the current layer of patterned features has been verified the information processing system 124 (or verification system 126) determines whether the current layer is to be securely marked at step 314. In one embodiment, the information processing system 124 utilizes the marking data 138 to determine whether the wafer 120 is to be marked for the current layer of patterned features. The marking data 138 may comprise data utilized by the information processing system 124 to determine when wafer marking is to be performed and what parameters are to be utilized for performing the marking process.

For example, the marking data 138 may comprise wafer identifiers, layer identifiers, marking species, marking dose/concentration, marking location, marking depth, marking size and/or the like. Wafer identifier data comprises a unique identifier associated with a wafer 120. Layer identifier data indicates at which fabrication layer or layers the wafer 120 is to be marked. In some embodiments, the layer identification data may also identify at which fabrication layer or layers the wafer 120 is not to be marked. Marking species data indicates an inert species such as helium or argon to be used for a given mark. Marking dose/concentration data indicates the marking parameters such as dose/concentration to be used for performing the marking process. The marking location data comprises coordinates or other location identifying mechanism indicating where on the wafer, die, etc. the mark is to be located. The marking depth data indicates the depth or depth at which the mark is to be located. The marking size data indicates the size of the area to be marked such as a 1 $\mu m^2$ area. The marking data 138 may be global across all wafers, specific to one or more wafers 120, to one or more dies, fabrication layers, and/or the like. The marking system 128 may be configured with the same marking data 138 for all wafers or different marking data 128 may be utilized for one or more different wafers, dies, fabrication layers, etc.

In some embodiments, the marking system 128 is configured to mark the wafer 120 after each layer of features has been patterned. In these embodiments, the information processing system 124 does not need to make the determination at step 314 whether marking is to be performed nor does the marking data 138 need to be analyzed for making this determination. However, the marking data 138 still may be utilized to determine the marking parameters/attributes for marking the wafer 120. In another embodiment, the information processing system 124 randomly determines when marking is to be performed. In these embodiments, the information processing system 124 is configured to randomly select at least one layer of patterned features for an associated marking process. The random selection may be performed on a per layer basis or any time during the fabrication process of the wafer 120. Accordingly, the information processing system 124 may utilize various mechanisms such as analysis of wafer data analysis, random selection, hard coding, and/or the like to determine when to perform wafer marking.

When the information processing system 124 determines that wafer marking is not to be performed, the system 106 further determines whether fabrication of the wafer 120 is completed at step 316. If the result of this determination is positive, the process flow returns to entry point A of FIG. 2 where processing is initiated for the next fabrication layer of the wafer 120. If the fabrication of the wafer 120 has completed, the process flows to entry point D of FIG. 4 where an inspection process is performed to verify wafer markings as will be discussed in greater detail below.

When the information processing system 124 determines that wafer marking is to be performed, the system 124 initiates the wafer marking system 128 and the wafer 120 is marked at step 318. In one embodiment, a mark is an inert species such as (but not limited to) helium, argon, and/or the like that is implanted within the wafer 120. Accordingly, any system capable of ion implantation may be utilized as the wafer marking system 128. In one embodiment, the marking process comprises implanting an inert species such as helium, argon, and/or the like at a given location within the backside (side opposite of patterned features) of the wafer 120 to form a security mark. In at least some embodiments, the security mark is not formed at the surface of the wafer backside but is a sub-surface mark (i.e., formed into and past the surface of the backside). Also, a single mark or multiple marks may be created for a given marking session. In addition, the implant may not only be performed at one or more locations but may also be performed at different depths, with different concentrations, and/or within a given area size (e.g., 1 $\mu m^2$). Example implant depths include 1 to 10 $\mu m$ and example implant concentrations include 1E16 to 1E20, although other implant depths and concentrations are applicable as well.

In one or more embodiments, the implanted security mark is not detectable to the human eye and requires a technique such (but not limited to) secondary-ion mass spectrometry (SIMS) to detect. Even if an unauthorized entity utilizes SIMS to try and locate the markings it would take an almost indefinite amount of time to locate the markings. For example, consider a marking size of 1 $\mu m^2$ on a 300 $mm^2$ semiconductor wafer having an area of 7E10 $\mu m^2$. If each 1 $\mu m^2$ SIMS scan takes 10 minutes it would take over 1 million years to scan the entire wafer.

The information processing system 124 may utilize the marking data 138 to determine the various marking attributes such as marking species, marking location, marking depth, marking concentration, marking size (e.g., 1 $\mu m^2$), and/or like for programming the wafer marking system 128. As discussed above, one or more of the marking attributes may be defined in the marking data 138 globally across all wafers or on a per wafer, die, and/or layer basis. In other embodiments, the marking data 138 may provide a list including one or more marking attributes that the wafer marking system 128 selects from for performing the marking operations. In some embodiments, the selection of the more marking attributes is random. For example, if the marking data 138 indicates that multiple species, locations, depth, and sizes may be used for marking the wafer 120 the information processing system 124 may randomly select of the various options for each of the marking attributes.

If the marking attributes were not predefined, the information processing system 124 records the selected marking attributes such as marking attributes such as marking species, marking location, marking depth, marking concentration, marking size, and/or like within the marking data 138. Once the information processing system 124 determines the marking attributes, the wafer marking system 128 utilizes these attributes/parameters to perform one or more operations for forming one or more security marks within the backside of the wafer 120. After the wafer 120 has been marked it is returned to the fabrication line where processing continues at step 202 of FIG. 2 for the patterning of additional layers of features. It should be noted that, in some embodiments, after the wafer 120 has been marked processing may flow to step 316 of FIG. 3 prior to being returned to the fabrication line after the wafer 120 has been marked.

Figure 4:
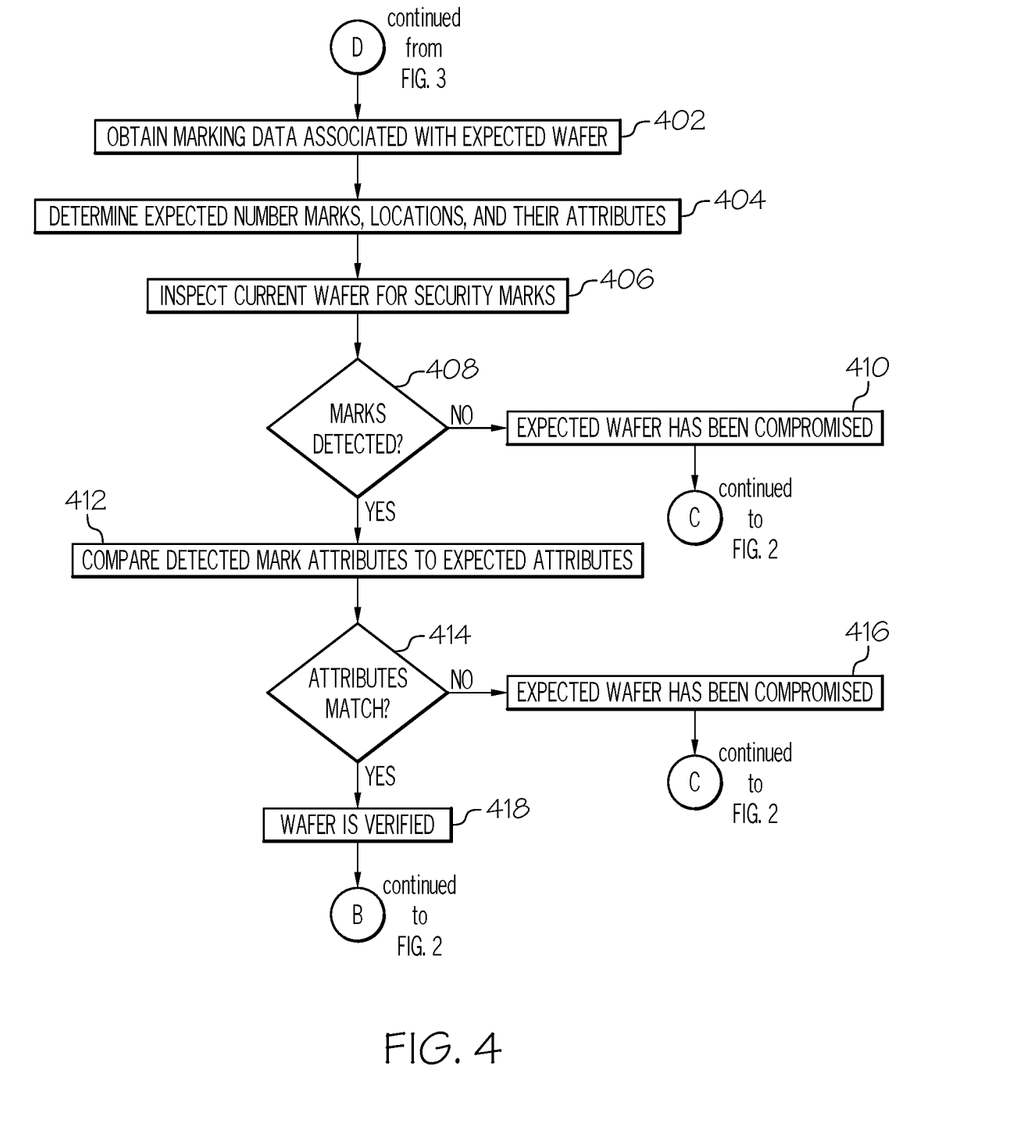
FIG. 4 is an operational flow diagram illustrating a more detailed process of the trusted wafer verification operation shown in step 212 of FIG. 2 according one embodiment of the present invention.

As discussed above, if the information processing system 124 determines that fabrication of the wafer 120 has been completed processing continues to entry point D of FIG. 4 where the wafer marking verification system 130 is initiated for inspection and verification of wafer markings. It should be noted that in embodiments where a customer's location comprises a waver marking verification system 130 the operations discussed below with respect to FIG. 4 may be performed after a customer has received a wafer from the semiconductor fabrication plant 102.

The verification system 130, at step 402, obtains marking data 138 for the wafer 120 it expects to have been received for marking verification. For example, if the verification system 130 expects Wafer_A to be the wafer received for marking verification then the verification system 130 obtains marking data 138 for Wafer_A. One or more tracking mechanisms typically utilized by fabrication lines may be utilized by the verification system 130 to identify the expected wafer 120.

As discussed above, the marking data 138 may be stored locally at the TWIMS 104 and/or on one or more remote information processing systems. Marking data 138 associated with the wafer 120 may be identified based on, for example, the identifier of the completed wafer 120. The verification system 130 at step 404, analyzes the obtained marking data 138 to determine how many security marks the current wafer 120 should have and their expected mark attributes. This data may be explicitly recorded within the wafer data 138 and/or may be derived from the wafer data 138.

Figure 8:
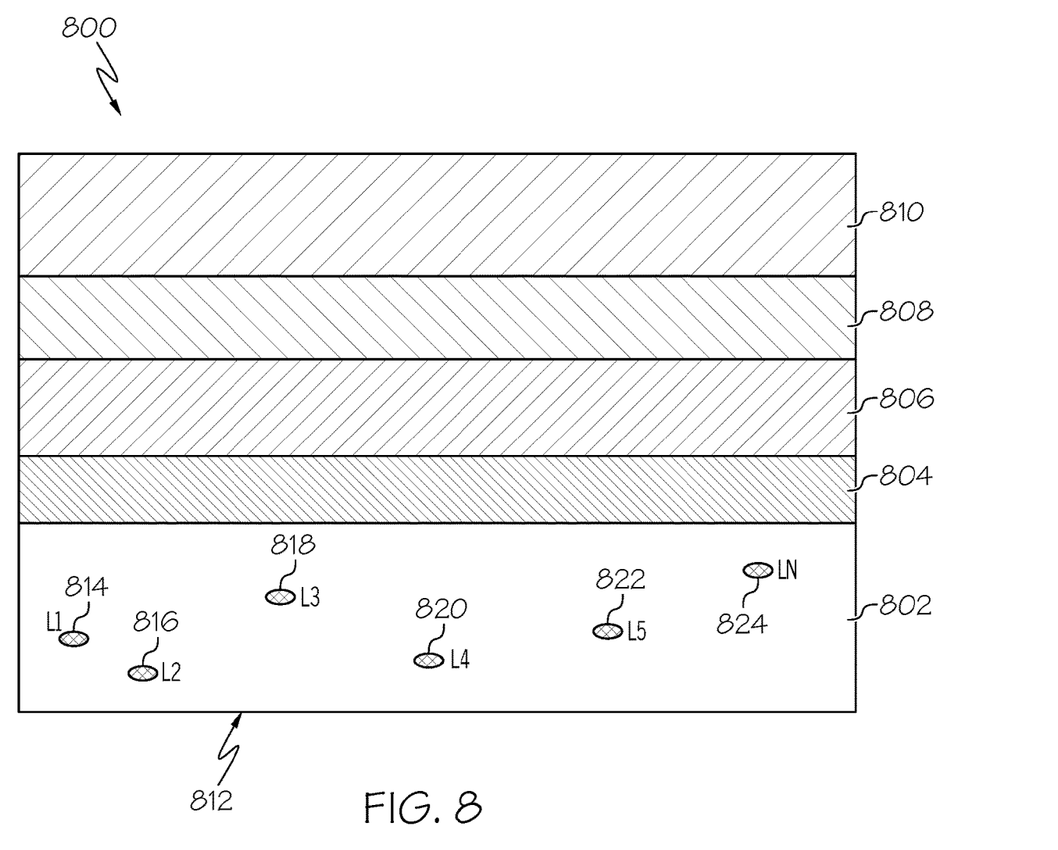
FIG. 8 is an illustrative example of a semiconductor wafer comprising a plurality of security marks implanted within a backside of the wafer according one embodiment of the present invention.

The verification system 130, at step 406, inspects the wafer 120 at each location and/or depth identified in the obtained marking data 138. In one embodiment, the verification system 130 utilizes secondary ion mass spectrometry (SIMS) and/or other inspection tools to detect security marks within wafer 120. Consider the example shown in FIG. 8, which illustrates a cross-section of a portion of a completed wafer 800. The wafer 800, in this example, comprises a substrate 802 and a plurality of layers 804 to 810 each comprising one or more patterned features. The verification system 130 inspects the backside 812 of the wafer 800 and determines that security marks 814 to 824 exist at locations L1 to LN. It should be noted that if the backside 812 comprises layers such as an oxide or nitride layer the verification system 130 may removes these layers prior to inspection.

The verification system 130, at step 408, determines if a mark was detected at the expected location. If a mark was not detected at the expected location the verification system 130 determines that expected wafer has been comprised and the current wafer is an unauthorized/imposter wafer at step 410. In other words, the verification system 130 determines that the expected wafer (e.g., Wafer_A) has been tampered with or replaced with a malicious wafer (e.g., Wafer_B). For example, if the wafer 800 illustrated in FIG. 8 was determined to have security marks 814 to 824 at locations L1 to LN and the marking data 138 obtained for the expected wafer indicated that security marks are located at locations LA, LX, and LY then the verification system 130 would determine that the wafer 800 is not the expected wafer but a compromised wafer (e.g., an imposter/malicious wafer). Upon this determination, processing flows to entry point C of FIG. 2 where one or more security measures are taken as discussed above.

However, if a mark was detected at the expected location the verification system 130, at step 412, compares the expected security mark attributes to the actual security mark attributes obtained by utilizing SIMS and/or other inspection tools. For example, the verification system 130 detects attributes such as marking species, marking dose/concentration, marking depth, marking size, and/or the like and compares these to the corresponding expected attributes. The verification system 130 then determines, at step 414, if the expected security mark attributes match the actual security mark attributes. If the verification system 130 determines that the actual security mark attributes fail to match the expected security mark attributes the system 130 determines, at step 416, that the expected wafer 120 has been tampered with or replaced. Therefore, the current wafer is considered a compromised wafer (e.g., an imposter/malicious wafer) and processing flows to entry point C of FIG. 2 where one or more security measures are taken as discussed above.

However, if the verification system 130 determines that the actual security mark attributes match the expected security mark attributes the system 130 determines, at step 418, that current wafer 120 is considered verified. In other words, the current wafer is the expected/authentic wafer and has not been compromised. The process flows to entry point B of FIG. 3 where dicing and packaging processes are performed on the verified wafer 120. The above processes may be continued for each wafer on the fabrication line.

Figure 9:
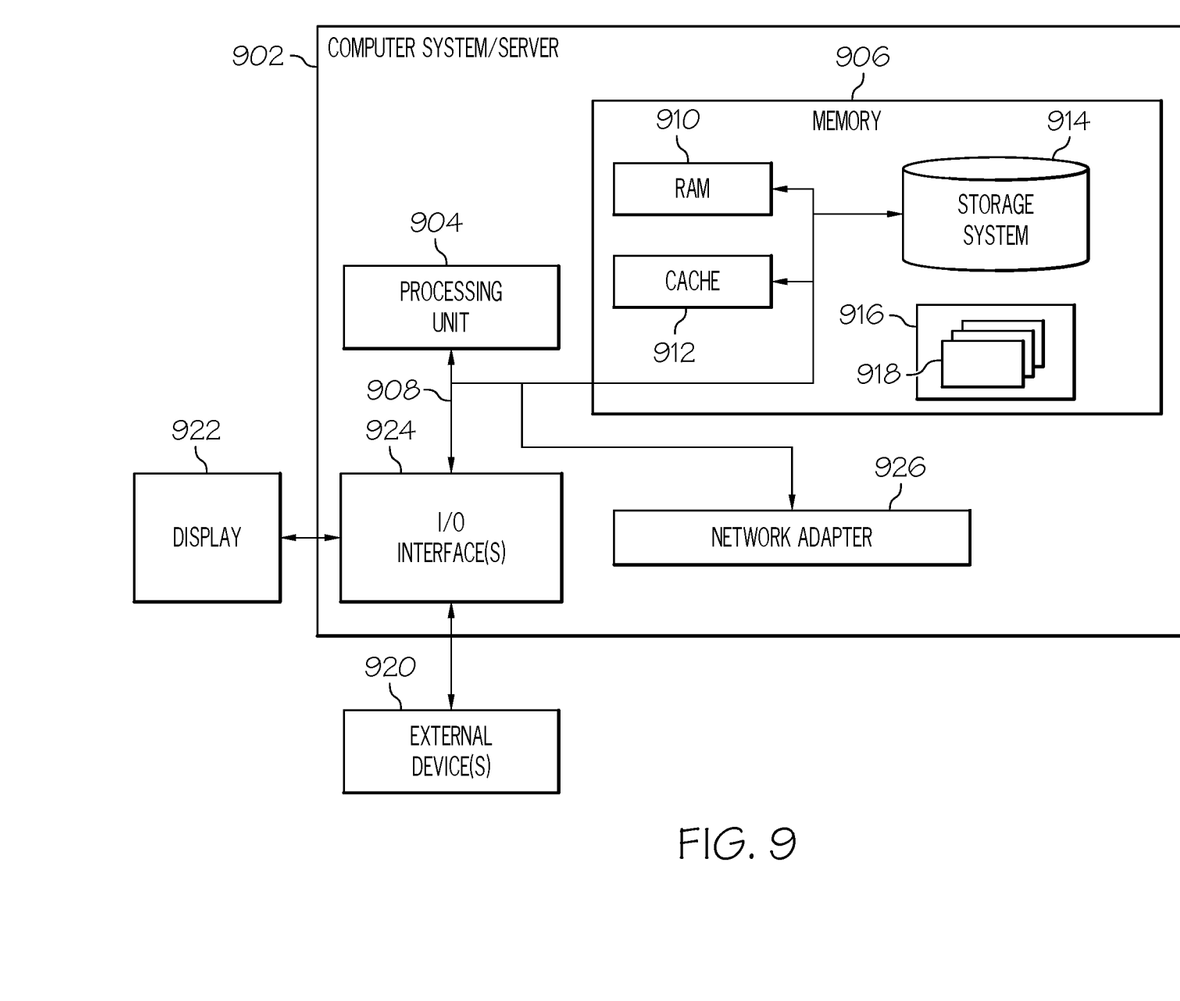
FIG. 9 is a block diagram illustrating one example of an information processing system according to one embodiment of the present invention.

FIG. 9 shows one example of a block diagram illustrating an information processing system 902 that may be utilized in embodiments of the present invention. The information processing system 902 may be based upon a suitably configured processing system configured to implement one or more embodiments of the present invention such as the information processing systems 102 and/or 104 of FIG. 1.

Any suitably configured processing system may be used as the information processing system 902 in embodiments of the present invention. The components of the information processing system 902 may include, but are not limited to, one or more processors or processing units 904, a system memory 906, and a bus 908 that couples various system components including the system memory 906 to the processor 904. The bus 908 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Although not shown in FIG. 9, the main memory 906 may include the various types of data 136, 138, and 140 discussed above with respect to FIG. 1. The system memory 906 may also include computer system readable media in the form of volatile memory, such as random access memory (RAM) 910 and/or cache memory 912. The information processing system 902 may further include other removable/non-removable, volatile/non-volatile computer system storage media. By way of example only, a storage system 914 may be provided for reading from and writing to a non-removable or removable, non-volatile media such as one or more solid state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each may be connected to the bus 908 by one or more data media interfaces. The memory 906 may include at least one program product having a set of program modules that are configured to carry out the functions of an embodiment of the present invention.

Program/utility 916, having a set of program modules 918, may be stored in memory 906 by way of example, and not limitation, as well as an operating system, one or more application programs, other program modules, and program data. Each of the operating system, one or more application programs, other program modules, and program data or some combination thereof, may include an implementation of a networking environment. Program modules 918 generally carry out the functions and/or methodologies of embodiments of the present invention.

The information processing system 902 may also communicate with one or more external devices 920 such as a keyboard, a pointing device, a display 922, etc.; one or more devices that enable a user to interact with the information processing system 902; and/or any devices (e.g., network card, modem, etc.) that enable computer system/server 902 to communicate with one or more other computing devices. Such communication may occur via I/O interfaces 924. Still yet, the information processing system 902 can communicate with one or more networks such as a local area network (LAN), a general wide area network (WAN), and/or a public network (e.g., the Internet) via network adapter 926. As depicted, the network adapter 926 communicates with the other components of information processing system 902 via the bus 908. Other hardware and/or software components can also be used in conjunction with the information processing system 902. Examples include, but are not limited to: microcode, device drivers, redundant processing units, external disk drive arrays, RAID systems, tape drives, and data archival storage systems.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. The terminology used herein is for the purpose of describing particular embodiments only and is not intended to be limiting of the invention.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

As will be appreciated by one skilled in the art, aspects of the present invention may be embodied as a system, method, or computer program product. Accordingly, various aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Python, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention have been discussed above with reference to flowchart illustrations and/or block diagrams of methods, apparatus (systems) and computer program products according to various embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Although specific embodiments have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

It should be noted that some features of the present invention may be used in one embodiment thereof without use of other features of the present invention. As such, the foregoing description should be considered as merely illustrative of the principles, teachings, examples, and exemplary embodiments of the present invention, and not a limitation thereof.

Also note that these embodiments are only examples of the many advantageous uses of the innovative teachings herein. In general, statements made in the specification of the present application do not necessarily limit any of the various claimed embodiments. Moreover, some statements may apply to some inventive features but not to others.

What is claimed is:

1. A method for securing and verifying a semiconductor wafer during fabrication, the method comprising:
   receiving a semiconductor wafer after a layer of features has been patterned thereon;
   determining if the layer of features matches an expected layer of features; and
   responsive to the layer of features matching the expected layer of features, forming at least one security mark at one or more locations embedded within a backside of the semiconductor wafer by implanting an inert species at the one or more locations, wherein the one or more locations include a depth within the backside of the semiconductor wafer that is different than a depth at which a previous security mark was formed.

2. The method of claim 1, wherein determining if the layer of features matches the expected layer of features comprises:
   obtaining design data defining the expected layer of features;
   obtaining imaging data for the layer of features that have been patterned on the semiconductor wafer; and
   determining if the imaging data corresponds to the design data.

3. The method of claim 1, further comprising:
   responsive to the layer of features failing to match an expected layer of features, determining that the semiconductor wafer has been compromised; and
   performing one or more security operations in response to determining that the semiconductor wafer has been compromised.

4. The method of claim 1, further comprising:
   obtaining security mark data for a received semiconductor wafer, the security mark data at least indicating the one or more locations at which the at least one security mark is expected;
   inspecting the received semiconductor wafer for detection of the at least one security mark at the one or more locations; and
   responsive to the at least one security mark having been detected at the one or more locations, determining that the semiconductor wafer has not been compromised.

5. The method of claim 4, further comprising:
   determining that the semiconductor wafer has been compromised and replaced with an unauthorized semiconductor wafer based on the at least one security mark failing to have been detected at the one or more locations; and
   performing one or more security operations.

6. The method of claim 4, wherein inspecting the received semiconductor wafer further comprises:
   identifying one or more mark attributes from the security mark data in addition to the one or more locations; and inspecting the received semiconductor wafer for detection of the one or more mark attributes.

7. A method for verifying authenticity of a semiconductor wafer, the method comprising:
receiving a semiconductor wafer;
obtaining security mark data for a semiconductor wafer expected to be received, the security mark data at least indicating one or more wafer locations at which at least one security mark is expected;
inspecting a backside of the received semiconductor wafer for detection of the at least one security mark implanted at the one or more wafer locations; and
determining that the received semiconductor wafer is a secure wafer based on the at least one security mark having been detected at the one or more wafer locations within the backside of the semiconductor wafer; or
determining that the received semiconductor wafer is a compromised wafer based on the at least one security mark failing to have been detected at the one or more wafer locations within the backside of the semiconductor wafer.

8. The method of claim 7, wherein inspecting the received semiconductor wafer further comprises:
identifying one or more mark attributes from the security mark data in addition to the one or more wafer locations; and
inspecting the received semiconductor wafer for detection of the one or more mark attributes.

9. The method of claim 8, wherein the received semiconductor wafer is determined to be a secure wafer further based on the one or more mark attributes having been detected.

10. The method of claim 8, wherein the received semiconductor wafer is determined to be a compromised wafer further based on the one or more mark attributes failing to have been detected.

11. The method of claim 8, wherein the one or more mark attributes comprise at least one of:

an identification of an implant species used for the at least one security mark;
a depth within the semiconductor wafer expected to have been received at which the at least one security mark was formed; and
a size of the at least one security mark.

12. The method of claim 7, further comprising:
preventing subsequent processing operations from being performed on the received semiconductor wafer in response to the at least one security mark failing to have been detected at the one or more wafer locations.

13. The method of claim 7, wherein inspecting the backside of the received semiconductor comprises:
inspecting the backside for detection of an implanted inert species representing the at least one security mark.

14. A method for securing and verifying a semiconductor wafer during fabrication, the method comprising:
receiving a semiconductor wafer after a first layer of features has been patterned thereon;
forming a first security mark at a first location embedded at a first depth within a backside of the semiconductor wafer by implanting an inert species at the first location;
receiving the semiconductor wafer after a second layer of features has been patterned thereon; and
forming a second security mark at a second location embedded at a second depth within the backside of the semiconductor wafer by implanting an inert species at the second location, wherein the second depth is different from the first depth.

15. The method of claim 14, wherein a combination of the first security mark, the second security mark, the first location, or the second location form a set of security attributes for determining if the semiconductor wafer is one of secure or compromised.

* * * * *